United States Patent
Franco et al.

(10) Patent No.: US 12,215,936 B2
(45) Date of Patent: Feb. 4, 2025

(54) HEAT SINK FOR AN ELECTRONIC BOARD OF A MOTOR VEHICLE MOTOR-DRIVEN FAN UNIT

(71) Applicant: Valeo Systemes Thermiques, Le Mesnil Saint-Denis (FR)

(72) Inventors: Ismaël Franco, Le Mesnil Saint-Denis (FR); Zhenxia Ma, Le Mesnil Saint-Denis (FR)

(73) Assignee: VALEO SYSTEMES THERMIQUES, Le Mesnil-Saint-Denis (FR)

( * ) Notice: Subject to any disclaimer, the term of this patent is extended or adjusted under 35 U.S.C. 154(b) by 648 days.

(21) Appl. No.: 17/430,149

(22) PCT Filed: Feb. 11, 2020

(86) PCT No.: PCT/FR2020/050243
§ 371 (c)(1),
(2) Date: Aug. 11, 2021

(87) PCT Pub. No.: WO2020/165536
PCT Pub. Date: Aug. 20, 2020

(65) Prior Publication Data
US 2022/0099386 A1 Mar. 31, 2022

(30) Foreign Application Priority Data
Feb. 12, 2019 (FR) ...................................... 1901364

(51) Int. Cl.
*F28F 3/04* (2006.01)
*F04D 25/06* (2006.01)
(Continued)

(52) U.S. Cl.
CPC ................ *F28F 3/04* (2013.01); *F04D 25/06* (2013.01); *F04D 29/5813* (2013.01); *H05K 7/2039* (2013.01)

(58) Field of Classification Search
CPC ........ F28F 3/04; F04D 25/06; F04D 29/5813; H05K 7/2039
(Continued)

(56) References Cited

U.S. PATENT DOCUMENTS 1,434,853 A * 11/1922 Spery .................... F28D 1/0358
165/DIG. 460
4,449,581 A 5/1984 Blystone et al.
(Continued)

OTHER PUBLICATIONS

International Search Report with Written Opinion in corresponding International Application No. PCT/FR2020/050243, mailed May 26, 2020 (10 pages).

*Primary Examiner* — Claire E Rojohn, III
(74) *Attorney, Agent, or Firm* — Osha Bergman Watanabe & Burton LLP

(57) ABSTRACT

The invention relates to a heat sink for an electronic board of a motor vehicle motor-driven fan unit, comprising a surface (2) intended for exchanging heat with an air flow set in motion by the motor-driven fan unit, referred to as exchange surface (2), said exchange surface (2) comprising a planar portion (3) arranged so that, in a position installed in the motor-driven fan unit, the air flow set in motion by the motor-driven fan unit flows substantially parallel to said planar portion (3), the exchange surface (2) also comprising a set of blind recesses (4) flush with said planar portion (3).

5 Claims, 3 Drawing Sheets

(51) Int. Cl.
*F04D 29/58* (2006.01)
*H05K 7/20* (2006.01)

(58) Field of Classification Search
USPC .......................................................... 165/80.2
See application file for complete search history.

(56) References Cited

U.S. PATENT DOCUMENTS

| | | | |
|---|---|---|---|
| 7,940,527 B2* | 5/2011 | Krause | H01L 23/473 |
| | | | 174/15.1 |
| 8,100,151 B2* | 1/2012 | Handa | F17C 11/005 |
| | | | 141/82 |
| 8,230,910 B2 | 7/2012 | Bielesch et al. | |
| 11,262,139 B2* | 3/2022 | Schlieper | F28F 1/325 |
| 2010/0096111 A1* | 4/2010 | Kucherov | F28F 13/02 |
| | | | 165/109.1 |
| 2010/0096117 A1* | 4/2010 | Seido | H01L 23/3733 |
| | | | 165/185 |
| 2012/0018134 A1* | 1/2012 | Polk, Jr. | F28F 3/04 |
| | | | 165/170 |
| 2012/0090812 A1* | 4/2012 | King | F24H 7/00 |
| | | | 165/53 |
| 2014/0060518 A1* | 3/2014 | Lee | F24S 10/754 |
| | | | 126/674 |
| 2016/0106004 A1* | 4/2016 | Ngyuen | H01L 23/3736 |
| | | | 428/137 |
| 2022/0244291 A1* | 8/2022 | Franco | B33Y 80/00 |
| 2024/0060729 A1* | 2/2024 | Yang | F28F 3/022 |

* cited by examiner

HEAT SINK FOR AN ELECTRONIC BOARD OF A MOTOR VEHICLE MOTOR-DRIVEN FAN UNIT

The invention relates to a heat sink for an electronic board of a motor vehicle motor-driven fan unit.

As a preference, such a motor-driven fan unit forms part of a heating, ventilation and/or air conditioning device of the motor vehicle, which regulates the temperature of an air flow intended to supply the interior of the vehicle.

The motor-driven fan unit, for its part, serves to make the air flow enter and circulate in the heating, ventilation and/or air conditioning device as far as outlet openings, where the air enters the vehicle interior.

The motor-driven fan unit in the known way comprises an electric motor, for example with brushes, on which an impeller is mounted to cause the air to move, and a device for controlling the electric motor, the electric motor control device comprising an electronic board.

Within the motor-driven fan unit, the purpose of the heat sink is to cool components of the motor control electronic board, particularly high-power components. In the conventional way, the heat sink takes the form of a plate equipped with studs projecting out from the plate, the plate and the studs being made from a thermally conducting material. This solution has the disadvantage of being bulky, because of the presence of the studs. In addition, the effectiveness of the cooling is not always satisfactory.

It is an object of the invention to provide a heat sink of reduced bulk and improved cooling effectiveness.

To this end, the invention relates to a heat sink for an electronic board of a motor-driven fan unit of a motor vehicle, comprising a surface intended for exchange of heat with an air flow set in motion by the motor-driven fan unit, referred to as exchange surface, said exchange surface comprising a planar portion configured such that, in a position installed in the motor-driven fan unit, the air flow set in motion by the motor-driven fan unit, flows substantially parallel to said planar portion, the exchange surface also comprising a set of blind cavities flush with said planar portion.

This configuration unexpectedly improves the convection of the air against the exchange surface, allowing the cooling by the heat sink to be rendered more effective. This configuration allows the bulkiness of the heat sink to be reduced, which also allows the aeraulics and the acoustics to be improved by reducing pressure drops. (Because the heat sink offers less resistance in the air flow).

According to another feature of the invention, each cavity comprises a part in the form of a truncated pyramid on a polygonal base and/or a part of constant cross section. The cross section of the part of constant cross section is polygonal.

According to another feature of the invention, the polygonal base is a hexagonal base.

According to another feature of the invention, the cavities have identical dimensions.

According to another feature of the invention, the set of cavities comprises two groups of cavities, the cavities of one group being mutually identical and different from the cavities of the other group.

According to another feature of the invention, the cavities are arranged in a quadrilateral, for example rectangular, grid and/or in an offset configuration and/or in a honeycomb configuration.

According to another feature of the invention, the cavities have the same orientation.

According to another feature of the invention, the cavities have the same orientation and identical dimensions.

According to another feature of the invention, a ratio between the depth of a cavity and the length of one side of the polygon of the base is comprised between 0.05 and 0.5.

According to another feature of the invention, a ratio between a length of a side of the polygonal base of a cavity and a distance between the centers of two consecutive cavities is comprised between 0.1 and 0.5.

According to another feature of the invention, the angle between the direction of flow of the air flow and a direction of a straight line joining two opposite vertices of the polygonal base is comprised between −15° and 15°.

According to another feature of the invention, the angle between the direction of flow of the air flow and a direction of a straight line joining two opposite vertices of the polygonal base is comprised between 75° and 105°.

According to another feature of the invention, the exchange surface is made from a material of aluminum alloy or of plastic.

The invention also relates to a method for manufacturing a heat sink as described hereinabove, comprising a step of molding the planar portion, and a step of hollowing-out recesses in the planar portion, so as to form the set of blind cavities lying flush with the planar portion. This method in two successive steps can be employed for example when the heat sink is made of plastic.

In a variant, the method for manufacturing the heat sink comprises a molding step that allows the planar surface and the set of blind cavities to be obtained directly. There is then no need to proceed to a subsequent step of hollowing-out recesses. Creating the set of cavities by direct molding is well suited to a heat sink made of an aluminum alloy.

The invention also relates to a motor-driven fan unit for a motor vehicle, comprising a motor, a fan for setting an air flow in motion that is configured to be controlled by the motor, and a control module for controlling said motor, the control module comprising an electronic board, the motor-driven fan unit also comprising a heat sink as described hereinabove designed to cool said electronic board.

According to another feature of the invention, the cavities of the heat sink are positioned facing a high-power electronic component of the electronic board.

BRIEF DESCRIPTION OF THE DRAWINGS

Other characteristics, details and advantages of the invention will become apparent upon reading the detailed description below, and upon analyzing the appended drawings, in which.

DESCRIPTION OF EMBODIMENTS

The invention relates to a heat sink for an electronic board of a motor vehicle motor-driven fan unit. The heat sink is referenced 1 in the figures.

The motor-driven fan unit preferably forms part of a heating, ventilation and/or air conditioning device of the motor vehicle.

Figure 4:
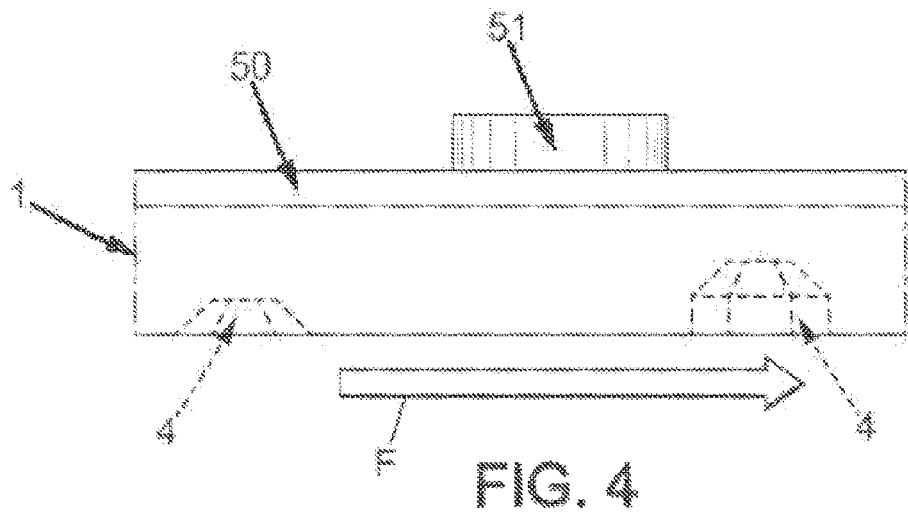
FIG. 4 illustrates a view in longitudinal section of part of a motor-driven fan unit equipped with a heat sink according to the present invention.

The motor-driven fan unit is designed to set in motion an air flow, preferably destined for the interior of the motor vehicle. The air flow is referenced F in FIG. 4. FIG. 4 also depicts the electronic board 50 and a high-power electronic component 51. The component may be a power transistor for controlling the electric motor of the motor-driven fan unit. The transistor may, for example, be an insulated-gate field effect transistor more commonly referred to by its acronym "MOSFET".

As is clear from FIGS. 1 to 5, the heat sink 1 comprises a surface 2 intended for exchanging heat with the air flow F, and referred to as exchange surface 2. The air flow F exchanges heat with the surface 2, notably by convection, and is thus cooled by the exchange surface 2.

Figure 1:
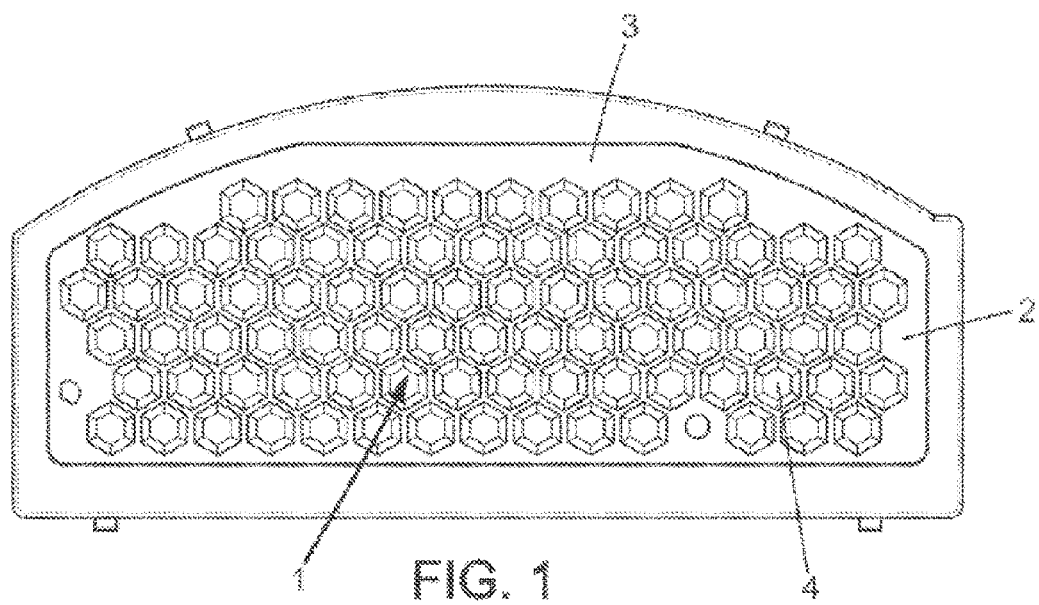
FIG. 1 illustrates a perspective view of a heat sink according to a first embodiment of the invention.
Figure 2:
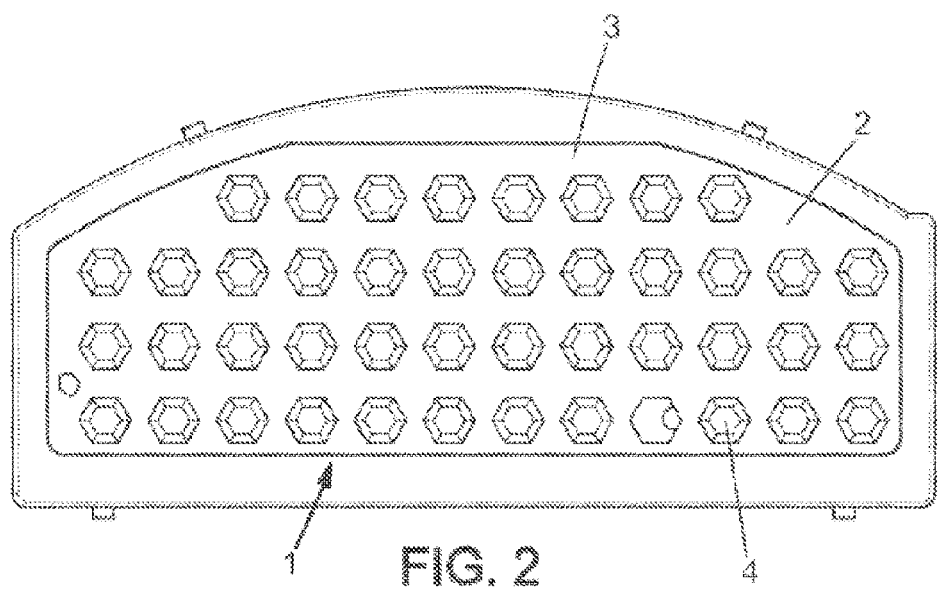
FIG. 2 illustrates a perspective view of the heat sink of FIG. 1, according to another variant.
Figure 3:
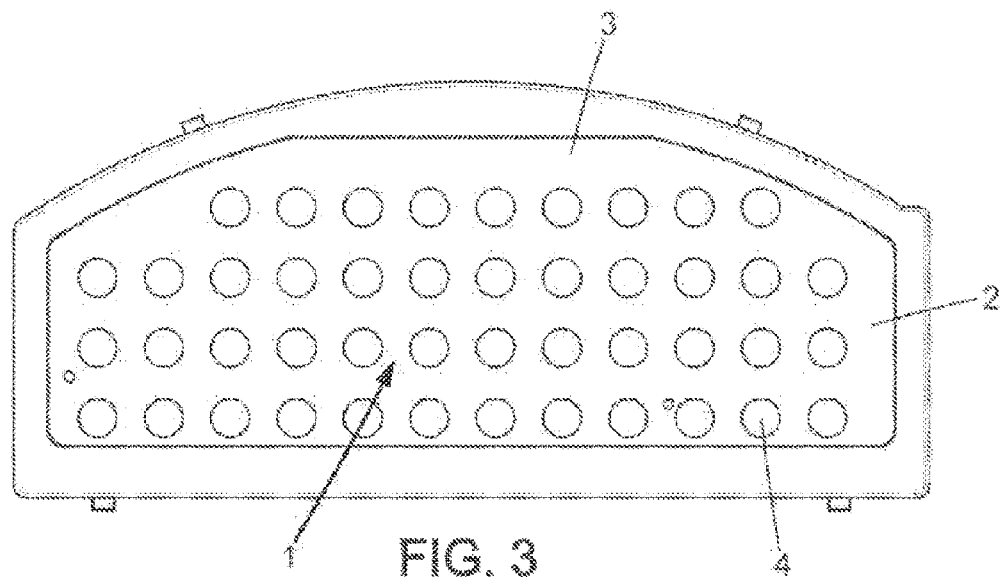
FIG. 3 illustrates a perspective view of a heat sink according to a second embodiment of the invention.

As illustrated in FIGS. 1 to 3, the exchange surface 2 comprises a planar portion 3 and set of cavities 4.

The planar portion 3 is arranged such that, in a position in which the heat sink 1 is installed in the motor-driven fan unit, the air flow set in motion by the motor-driven fan unit flows substantially parallel to said planar portion, as can be seen in FIG. 4.

As illustrated in FIGS. 1 to 3, the cavities 4 lie flush with the planar portion 3 and are blind. The planar portion 3 of the surface 2 is free of additions of material that could impede the air flow F. In other words, the region bordering each cavity 4 is planar.

The cavities 4 may take various shapes that are now described in detail.

According to a first embodiment, the shape of one or more cavities 4 comprises a part in the form of a truncated pyramid on a polygonal base: FIGS. 1 and 2 illustrate cavities 4 of hexagonal-base truncated-pyramid shape.

FIG. 4 illustrates a first type of cavity in the shape of a truncated pyramid, and a second type of cavity comprising (starting from the surface) a first part of constant cross section (from 0 to 2 mm in depth) and then the part in the shape of a truncated pyramid. The first part of constant cross section has a polygonal cross section. This first part of constant cross section therefore has the shape of a polygonal-base right prism. The part in the shape of a truncated pyramid is connected to the part of constant cross section and constitutes the prolongation thereof. Each generatrix of the part of constant cross section meets an edge corner of the part in the shape of a truncated pyramid.

This hexagonal-base truncated-pyramid shape is the preferred shape of the Applicant Company insofar as simulations and experimental characterizations have demonstrated that, surprisingly, it is this shape that offers the best compromise between the effectiveness of the cooling afforded by the flow F, the noise generated by the flowing of the air flow F, and the pressure drops caused in the air flow F.

The table below summarizes the performance aspects obtained with three different shapes of cavity. The scale used is graduated from 0 to 5, 0 corresponding to the poorest performance and 5 corresponding to the best performance.

|  | Truncated pyramid with hexagonal base | Hemisphere | Cube |
| --- | --- | --- | --- |
| Cooling | 3 | 2 | 4 |
| Noise level | 4 | 3 | 3 |
| Pressure drops | 4 | 3 | 3 |

It may be noted that the cavities in the shape of a truncated pyramid on a hexagonal base offer the best compromise.

According to a second embodiment, the shape of one or more cavities 4 is a hemisphere: FIG. 3 illustrates this shape.

Of course, the invention is not restricted to the embodiments illustrated and other shapes are entirely conceivable.

Note that the cavities 4 may all be identical or, on the other hand, may differ from one another in terms of their shape and/or their dimensions.

In particular, the cavities 4 may be distributed in two or more groups, the cavities 4 of the same group being mutually identical, and different from one group to another.

The cavities 4 are distributed over the exchange surface 2 in a grid, certain embodiments of which are illustrated in FIGS. 1 to 3.

What is meant by a grid is that the network of cavities 4 is organized into a given pattern.

A first type of grid, illustrated in FIG. 1, is a honeycomb structure, namely one in which the centers of the cavities 4 are aligned in two directions making an angle of 60° between them.

What is meant by the center is the point of intersection of the bisectors of the sides of the base of the polygon of the cavity 4.

A second type of grid, illustrated in FIGS. 2 and 3, is of a quadrilateral type, namely one in which the centers of the cavities 4 are aligned in two mutually orthogonal directions.

Another type of grid, not illustrated, is an offset configuration, namely one in which the centers of the cavities 4 are aligned in two directions making an angle of 45° between them.

Figure 5:
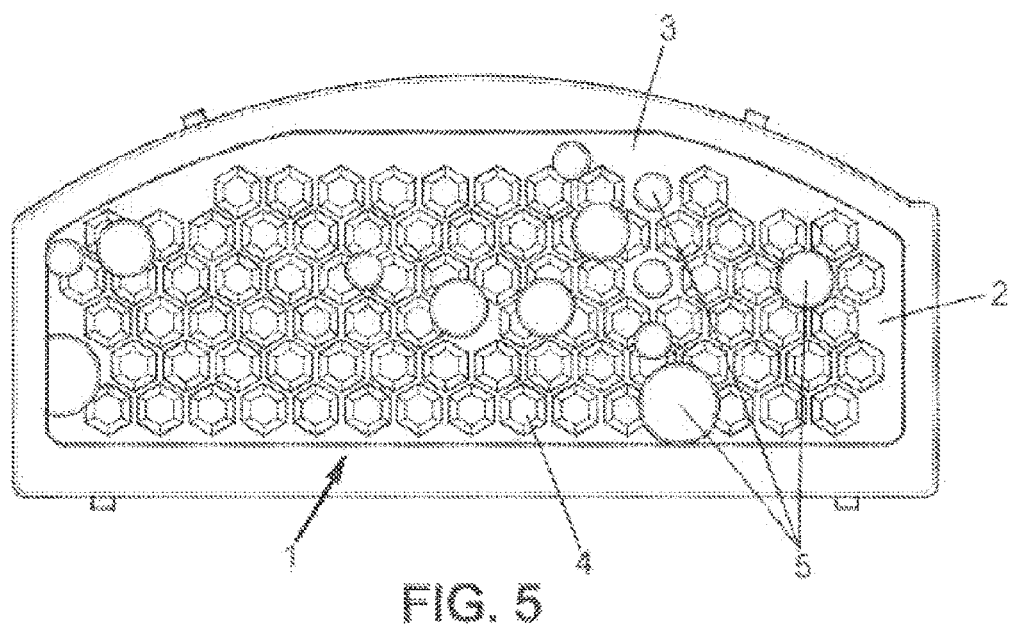
FIG. 5 illustrates a perspective view of the heat sink of FIG. 1, according to a third embodiment of the invention.

In FIG. 5, the heat sink 1 is also equipped with studs 5 projecting out from the surface 2 to remove the heat produced by the components. The distribution of the studs 5 and the dimensions thereof are dependent on the need to dissipate heat.

Note that the fill factor for the set of cavities 4, their spacing, and their depth are notably dependent on the level of cooling desired.

For example, for the variant of FIG. 2, the spacing between the cavities 4 in the first direction D1 is 8 mm, and 8.5 mm in a second direction D2. The chosen depth is 2 mm, or even 1 mm.

Advantageously, a ratio between the depth of a cavity 4 and the length of one side of the polygon is comprised between 0.05 and 0.5.

Likewise, a ratio between a length of a side of the polygonal base of a cavity 4 and a distance between the centers of two consecutive cavities is comprised between 0.1 and 0.5.

In the embodiments illustrated, the cavities 4 have the same orientation, a given translation defining the progression between one cavity 4 and an adjacent cavity 4.

According to one embodiment, the orientation is such that an angle between the direction of flow of the air flow F and a direction of a straight line joining two opposite vertices of the polygonal base is comprised between −15° and 15°.

According to another embodiment, the orientation is such that an angle between the direction of flow of the air flow F and a direction of a straight line joining two opposite vertices of the polygonal base is comprised between 75° and 105°, preferably between 75° and 90°.

As a preference, the exchange surface 2 is made from a material of aluminum alloy or of plastic, particularly a thermally conducting plastic, for example made up of a mixture of polymer and thermally-conducting (graphite, metallic, ceramic, etc.) fibers. Such a material exhibits anisotropic thermal properties, the thermal conductivity differing according to the orientation of the fibers in the thermally-conducting plastic.

The invention also relates to a method for manufacturing the heat sink 1, comprising a step of molding the planar portion 3, and potentially a step of hollowing-out recesses in the planar portion 3, so as to form the set of blind cavities 4 lying flush with the planar portion.

The step of hollowing-out recesses is advantageously performed by machining the surface of the planar portion.

It will be noted that during the step of molding the planar portion 3, depending on the material used (anisotropic plastic material), the material orients itself according to the shape of the mold and the fibers oriented parallel to the walls of the mold have the effect of reducing the thermal conduction of the heat sink 1. By having cavities 4 that are created by hollowing-out recesses, the proportion of incorrectly oriented fibers is reduced, thereby increasing the effectiveness of the heat sink.

The invention claimed is:

1. A heat sink for an electronic board of a motor-driven fan unit of a motor vehicle, comprising
    an exchange surface configured for exchange of heat with an air flow set in motion by the motor-driven fan unit, said exchange surface comprising:
        a planar portion configured such that, in a position installed in the motor-driven fan unit, the air flow set in motion by the motor-driven fan unit flows substantially parallel to said planar portion; and
        a set of blind cavities flush with said planar portion,
        wherein each blind cavity comprises a part in a form of a truncated pyramid on a polygonal base and/or a part of constant cross section, and
        wherein the polygonal base is a hexagonal base.

2. The heat sink as claimed in claim 1, wherein the set of blind cavities is arranged in a quadrilateral, wherein the quadrilateral is rectangular, grid and/or in an offset configuration and/or in a honeycomb configuration.

3. The heat sink as claimed in claim 1, wherein the blind cavities have the same orientation.

4. The heat sink as claimed in claim 1, wherein a ratio between a depth of each blind cavity and a length of one side of the polygonal base is comprised between 0.05 and 0.5.

5. The heat sink as claimed in claim 1, wherein the exchange surface is made from a material of aluminum alloy or of plastic.

* * * * *